United States Patent
Bourstein

(10) Patent No.: US 9,337,660 B1
(45) Date of Patent: May 10, 2016

(54) SWITCHING ARRANGEMENT FOR POWER SUPPLY FROM MULTIPLE POWER SOURCES

(71) Applicant: Marvell Israel (M.I.S.L.) Ltd., Yokneam (IL)

(72) Inventor: Ido Bourstein, Pardes Hana (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 733 days.

(21) Appl. No.: 13/711,420

(22) Filed: Dec. 11, 2012

Related U.S. Application Data

(60) Provisional application No. 61/570,168, filed on Dec. 13, 2011, provisional application No. 61/578,594, filed on Dec. 21, 2011.

(51) Int. Cl.
*H02J 4/00* (2006.01)

(52) U.S. Cl.
CPC .................................. *H02J 4/00* (2013.01)

(58) Field of Classification Search
CPC ............................................. H02J 4/00
USPC ........................................................ 307/87
See application file for complete search history.

(56) References Cited

U.S. PATENT DOCUMENTS

| | | | |
|---|---|---|---|
| 6,847,249 B1* | 1/2005 | Brokaw | H03K 17/693 327/407 |
| 2003/0098616 A1* | 5/2003 | Wu | G09G 3/3611 307/85 |
| 2009/0146499 A1* | 6/2009 | Takeda | G11C 16/30 307/80 |

* cited by examiner

*Primary Examiner* — Thienvu Tran
*Assistant Examiner* — Kevin J Comber

(57) ABSTRACT

Some of the embodiments of the present disclosure provide a system comprising a functional block; a plurality of power sources, each of the plurality of power sources being maintained at a corresponding voltage; and a switching module having a plurality of switches, the switching module configured to supply power from at least one of the plurality of power sources to the functional block, each of the plurality of switches being controlled by a corresponding switching signal having a voltage value that is one of (i) a ground voltage and (ii) a high max voltage, the high max voltage corresponding to a highest voltage among the voltages of the plurality of power sources. Other embodiments are also described and claimed.

22 Claims, 9 Drawing Sheets

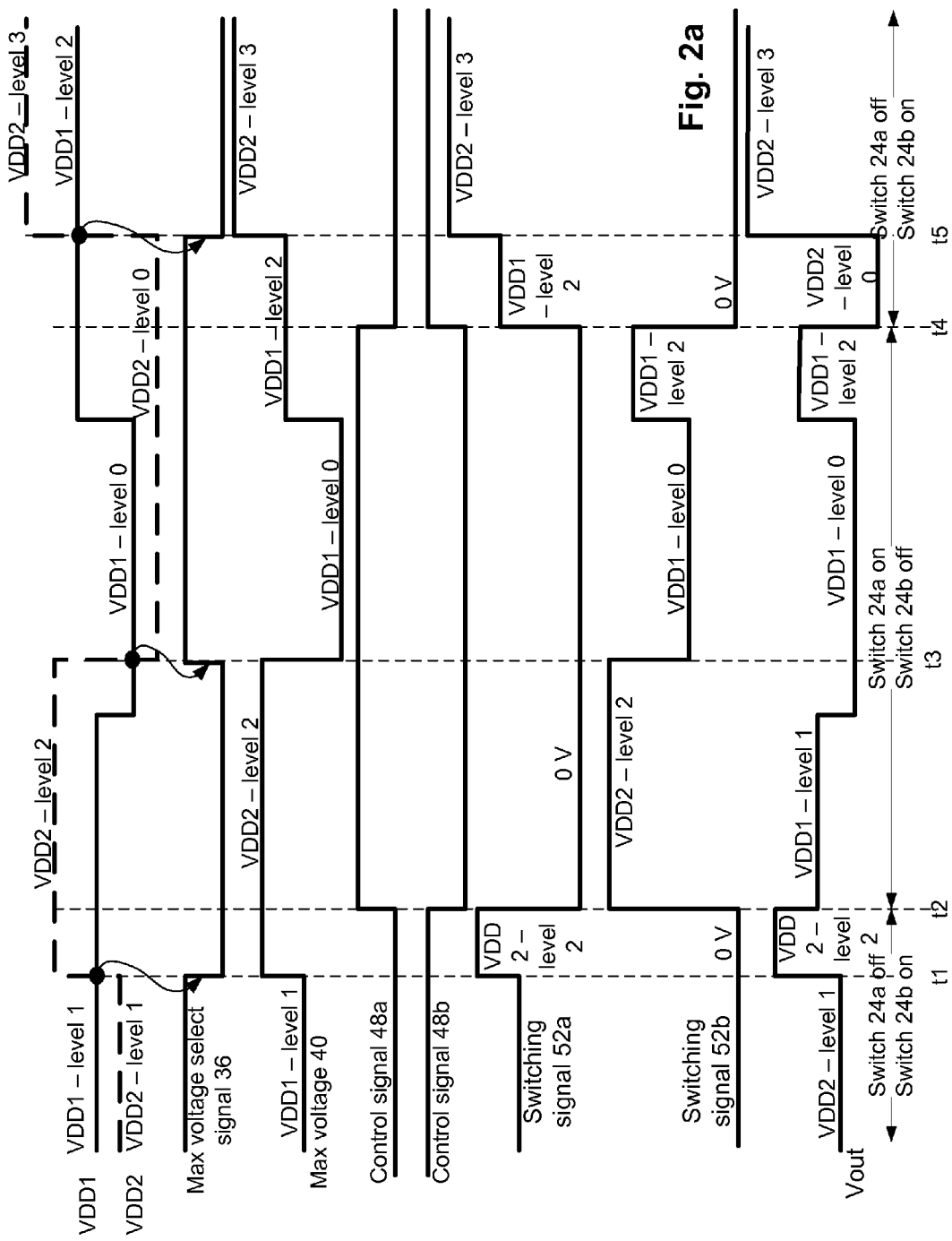

SWITCHING ARRANGEMENT FOR POWER SUPPLY FROM MULTIPLE POWER SOURCES

CROSS REFERENCE TO RELATED APPLICATIONS

The present application claims priority to U.S. Patent Application No. 61/570,168, filed on Dec. 13, 2011, and to U.S. Patent Application No. 61/578,594, filed on Dec. 21, 2011, the entire specifications of which are hereby incorporated by reference in their entireties for all purposes, except for those sections, if any, that are inconsistent with this specification.

TECHNICAL FIELD

Embodiments of the present disclosure relate to switching arrangements, and more specifically, to switching arrangements for power supply from multiple power sources.

BACKGROUND

Unless otherwise indicated herein, the approaches described in this section are not prior art to the claims in the present disclosure and are not admitted to be prior art by inclusion in this section.

A functional block may selectively require power that is supplied at different voltage levels. As an example, during a first time period, the functional block requires power at a first voltage level; and during a second time period, the functional block requires power at a second voltage level different from the first voltage level. Selectively supplying power to the functional block may be achieved using switches that govern power supply from different power sources operating at respectively different voltage levels. However, it may not be possible to fully turn on and/or fully turn off conventional switches during operation, particularly when the voltage of the first power source is different from the voltage of the second power source.

SUMMARY

In various embodiments, the present disclosure provides a system comprising a functional block; a plurality of power sources, each of the plurality of power sources being maintained at a corresponding voltage; and a switching module having a plurality of switches, the switching module configured to supply power from at least one of the plurality of power sources to the functional block, each of the plurality of switches being controlled by a corresponding switching signal having a voltage value that is one of (i) a ground voltage and (ii) a high max voltage, the high max voltage corresponding to a highest voltage among the voltages of the plurality of power sources.

In an embodiment, there is also provided a method comprising maintaining a plurality of power sources at a corresponding plurality of voltages, such that each of the plurality of power sources is maintained at a corresponding voltage of the plurality of voltages; and controlling a switching module to supply power from at least one of the plurality of power sources to a functional block, the switching module comprising a plurality of switches, wherein controlling the switching module further comprises: controlling respective switches of the plurality of switches using a corresponding switching signal of a plurality of switching signals, respective switching signals of the plurality of switching signals having a voltage value that is one of (i) a ground voltage and (ii) a max voltage, the max voltage corresponding to a highest voltage among the plurality of voltages of the plurality of power sources.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIG. 2a illustrates a timing diagram of various signals of the system of FIG. 1, in accordance with an embodiment of the present disclosure.

DETAILED DESCRIPTION

Figure 1:
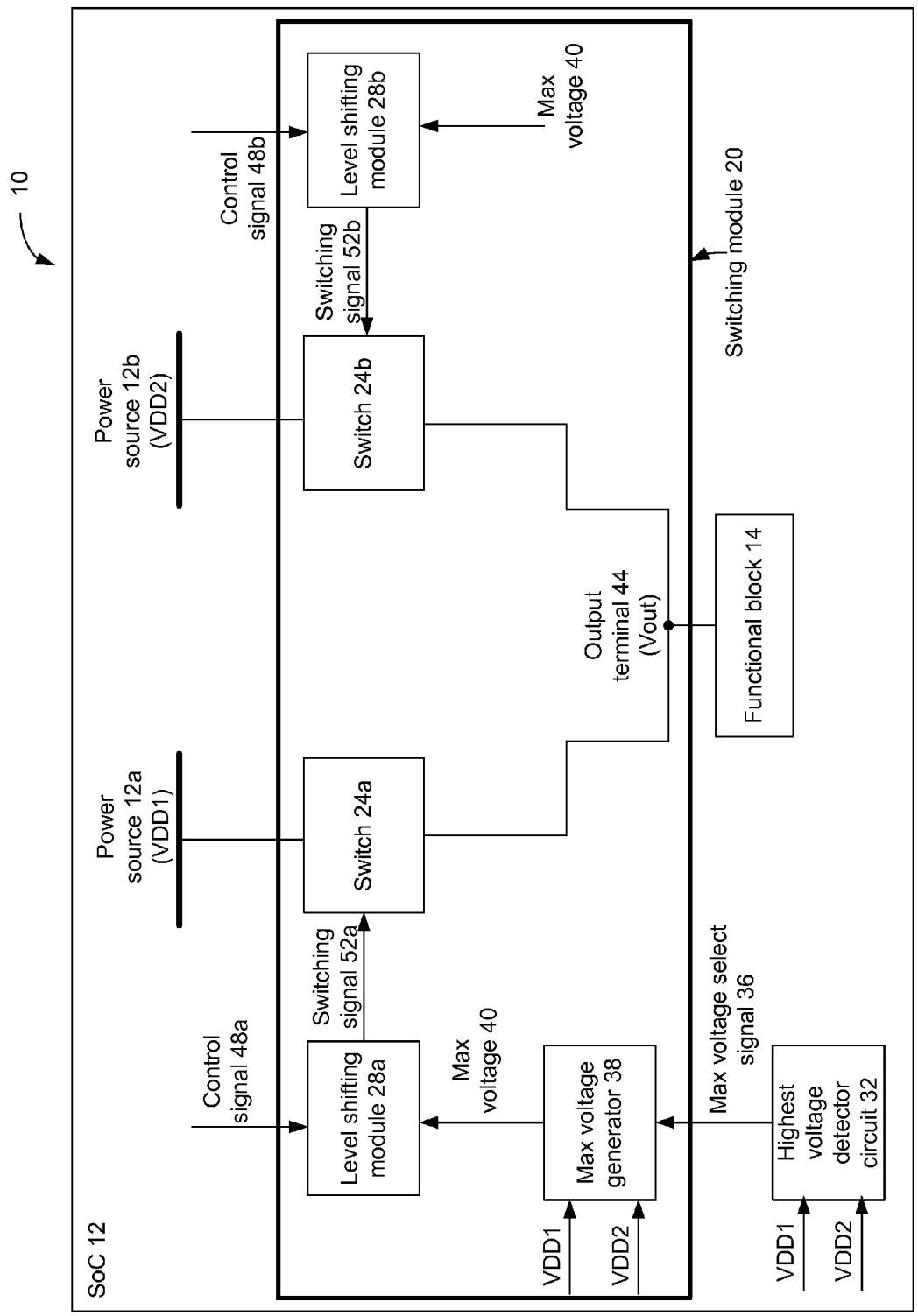
FIG. 1 schematically illustrates a system comprising a functional block, a switching module, and a plurality of power sources, in accordance with an embodiment of the present disclosure.

FIG. 1 schematically illustrates a system 10 comprising a functional block 14, a switching module 20, and a plurality of power sources 12a and 12b. The power source 12a is at voltage VDD1, and the power source 12b is at voltage VDD2, in an embodiment. In some embodiments, the respective voltage levels of VDD1 and VDD2, respectively, are different from one another and vary over time. The switching module 20 is configured to supply power from one of the power sources 12a and 12b to the functional block 14. The switching module 20 comprises a plurality of switches 24a, 24b that are controlled by a corresponding plurality of switching signals. In the FIG. 1 example, the switch 24a is controlled by a switching signal 52a to selectively supply power from the power source 12a to the functional block 14, and similarly the switch 24b is controlled by a switching signal 52b to selectively supply power from the power source 12b to the functional block 14. Supply of the respective switching signals 52a and 52b are governed by respective control signals 48a and 48b. Typically, the control signals are provided so that any given time, power is supplied to functional block 14 selectively by one of the power sources 12a and 12b. In an embodiment, the system 10 is included in a system on a chip (SoC) 12, although in another embodiment (and not illustrated in FIG. 1), one or more components of the system 10 are external to the SoC 12.

In an embodiment, the switching module 20 comprises a max voltage generator 38. The max voltage generator 38 outputs a max voltage 40 that has a voltage level corresponding to a highest voltage among the voltages of the plurality of power sources 12a, 12b. In an embodiment, each of the switching signals 52a, 52b is output by a level shifting module 28a, 28b, which is configured to cause the switching signals 52a, 52b to have a voltage value that is one of (i) a ground voltage and (ii) the voltage of the max voltage 40.

For example, if the switch 24a is to be turned on and the switch 24b is to be turned off (i.e., if power is to be supplied from the power source 12a to the functional block 14), then the switching signal 52a is driven to the ground voltage, and the switching signal 52b is driven to the max voltage 40, namely the highest voltage among the respective power sources (e.g., assuming that the switches 24a and 24b comprises P type transistors). Driving the switching signal 52b to specifically the max voltage 40 (e.g., instead of any other voltage level), in an embodiment, ensures that the switch 24b is fully switched off (e.g., prevents partial switching off of the switch 24b, thereby preventing current from leaking from the power source 12a, through the partially off switch 24b, towards the power source 12b), as will be discussed in more details herein later. In another example (e.g., assuming that the switches 24a and 24b comprises N type transistors), if the switch 24a is to be turned off and the switch 24b is to be turned on (i.e., if power is to be supplied from the power source 12b to the functional block 14), then the switching signal 52a is driven to the ground voltage, and the switching signal 52b is driven to the max voltage 40, namely the highest voltage among the respective power sources. This ensures, for example, that the switch 24a is fully switched off, as will be discussed in more details herein later.

In an embodiment, an output of the switches 24a and 24b are coupled to an output terminal 44 (which is at an output voltage Vout), and the functional block 14 receives power from the output terminal 44. The functional block 14 can be any appropriate functional block that requires power from one of a plurality of power sources. Merely as an example, the functional block is an appropriate type of a memory device, or any other appropriate type of electronic device that selectively requires power from multiple power sources. Although only two power sources 12a and 12b are illustrated in FIG. 1, in an embodiment, more than two power sources may be coupled to the switching module 20.

FIG. 2a illustrates a timing diagram of various signals of the system 10 of FIG. 1. In an embodiment, the voltages VDD1 and VDD2 may vary with time (e.g., are DC voltages that vary with time), e.g., as illustrated in FIG. 2a (in FIG. 2a, voltage VDD1 is illustrated using solid lines, while voltage VDD2 is illustrated using broken lines). FIG. 2a illustrates various levels of the voltages VDD1 and VDD2.

Referring again to FIG. 1, in an embodiment, the system 10 also comprises a highest voltage detector circuit 32 configured to generate a max voltage select signal 36. The max voltage select signal 36 identifies a power source of the power sources 12a, 12b that has the highest voltage among the voltages VDD1 and VDD2 of the power sources 12a, 12b (e.g., provides an indication of which of the power sources 12a, 12b has the highest voltage). In the embodiment of FIG. 1 in which two power sources 12a and 12b are coupled to the switching module 20, the max voltage select signal 36 is, for example, a single bit signal providing an indication of which of the power sources 12a, 12b has the highest voltage. For example, as illustrated in FIG. 2a, a value of 1 of the max voltage select signal 36 (e.g., between time t3 and time t5 in FIG. 2a) indicates the power source 12a as having the highest voltage among the voltages of the power sources 12a and 12b (i.e., indicates that VDD1>VDD2); and a value of 0 of the max voltage select signal 36 (e.g., between time t1 and time t3 in FIG. 2a) indicates the power source 12b as having the highest voltage among the voltages of the power sources 12a and 12b (i.e., indicates that VDD2>VDD1).

If, for example, a number of power sources coupled to the switching module 20 increases, a number of bits in the max voltage select signal 36 can also increase correspondingly to be able to identify a power source that has the highest voltage among the voltages of the plurality of power sources. For example, if four power sources (e.g., instead of two) are present in the system 10, the max voltage select signal 36 can comprise two bits.

In an embodiment, and although not illustrated in FIG. 1, the highest voltage detector circuit 32 comprises a voltage comparator (e.g., an analog or other suitable voltage comparator) to compare the voltages VDD1 and VDD2, and accordingly to generate the max voltage select signal 36. In another embodiment, and although not illustrated in FIG. 1, the highest voltage detector circuit 32 receives information from an appropriate component (e.g., a component that controls the voltages VDD1 and/or VDD2, or otherwise has information regarding the voltages VDD1 and/or VDD2) regarding the voltages VDD1 and/or VDD2 (e.g., regarding which of the voltages VDD1 and VDD2 is higher at a given time), and accordingly generates the max voltage select signal 36 based on such information.

The system 10 also comprises a max voltage generator 38 that is configured to receive (i) the max voltage select signal 36 and (ii) the voltages VDD1 and VDD2 of the power sources 12a and 12b, respectively. The max voltage generator 38 is configured to generate the max voltage 40. As previously alluded to and as illustrated in FIG. 2a, the max voltage 40 is equal to the highest voltage among the voltages VDD1 and VDD2 of the power sources 12a and 12b, respectively. For example, when the max voltage select signal 36 is high (i.e. when VDD1>VDD2, e.g., between time t3 and t5 in FIG. 2a), the max voltage 40 is equal to VDD1; and when the max voltage select signal 36 is low (i.e., when VDD2>VDD1, e.g., between time t1 and t3 in FIG. 2a), the max voltage 40 is equal to VDD2. Thus, in an embodiment, the max voltage generator 38 selectively outputs one of the voltages VDD1 and VDD2 (or a voltage that is substantially equal to one of the voltages VDD1 and VDD2) as the max voltage 40, based on the max voltage select signal 36.

Figure 2B:
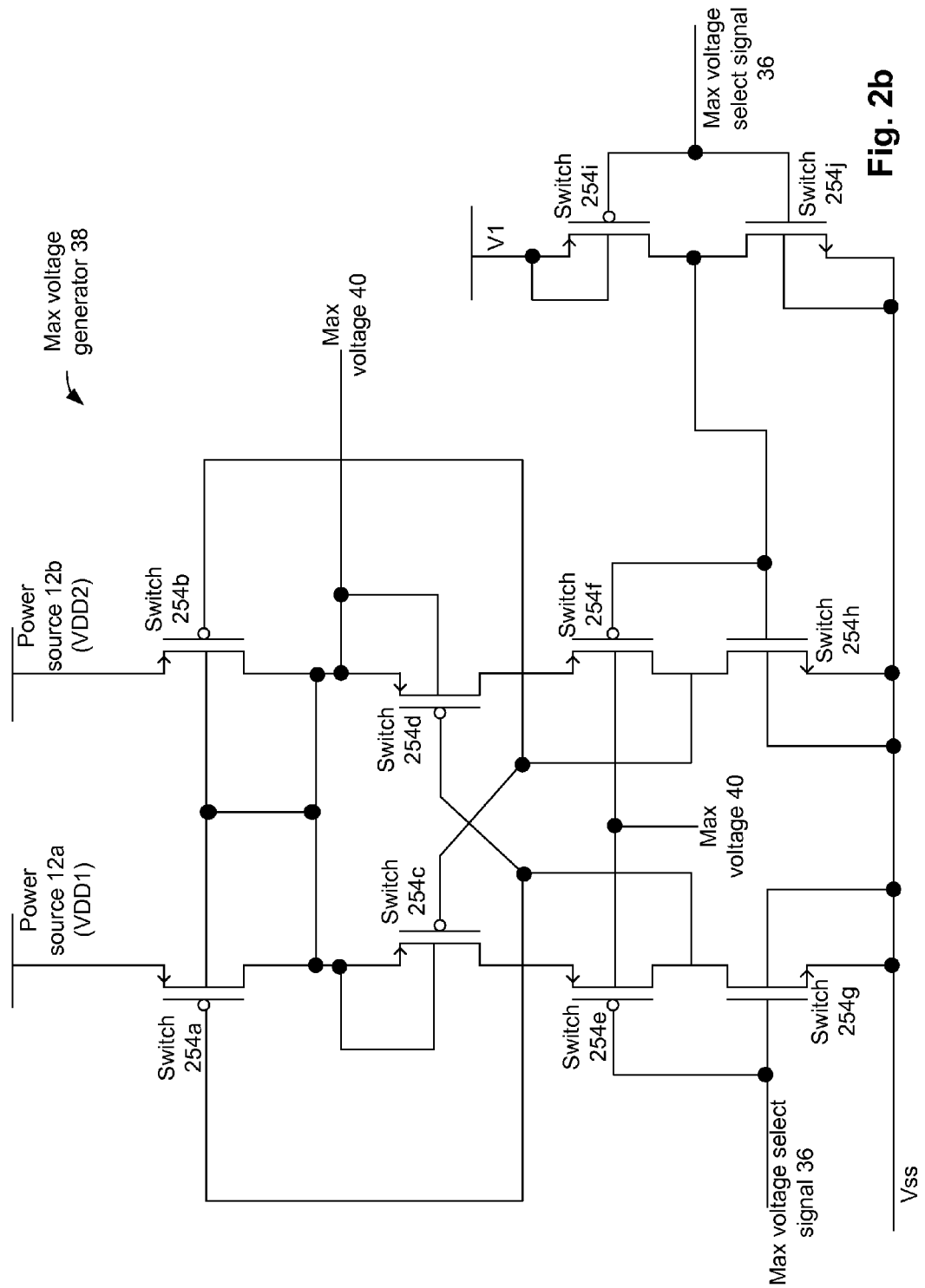
FIG. 2b schematically illustrates an example implementation of a max voltage generator, in accordance with an embodiment of the present disclosure.

FIG. 2b schematically illustrates an example implementation of the max voltage generator 38. In an embodiment, the max voltage generator 38 comprises a plurality of switches, e.g., switches 254a, . . . , 254j coupled in the manner as illustrated in FIG. 2b Some of the switches are P-type switches (e.g., switches 254a, . . . , 254f and 254i), while some of the switches are N-type switches (e.g., switches 254g, 254h and 254j). The max voltage generator 38 receives the max voltage select signal 36 and the voltages VDD1 and VDD2, and generates the max voltage 40, as illustrated in FIG. 2b. Although FIG. 2b illustrates an example implementation of the max voltage generator 38, the max voltage generator 38 can be implemented in any other appropriate manner.

Figure 3:
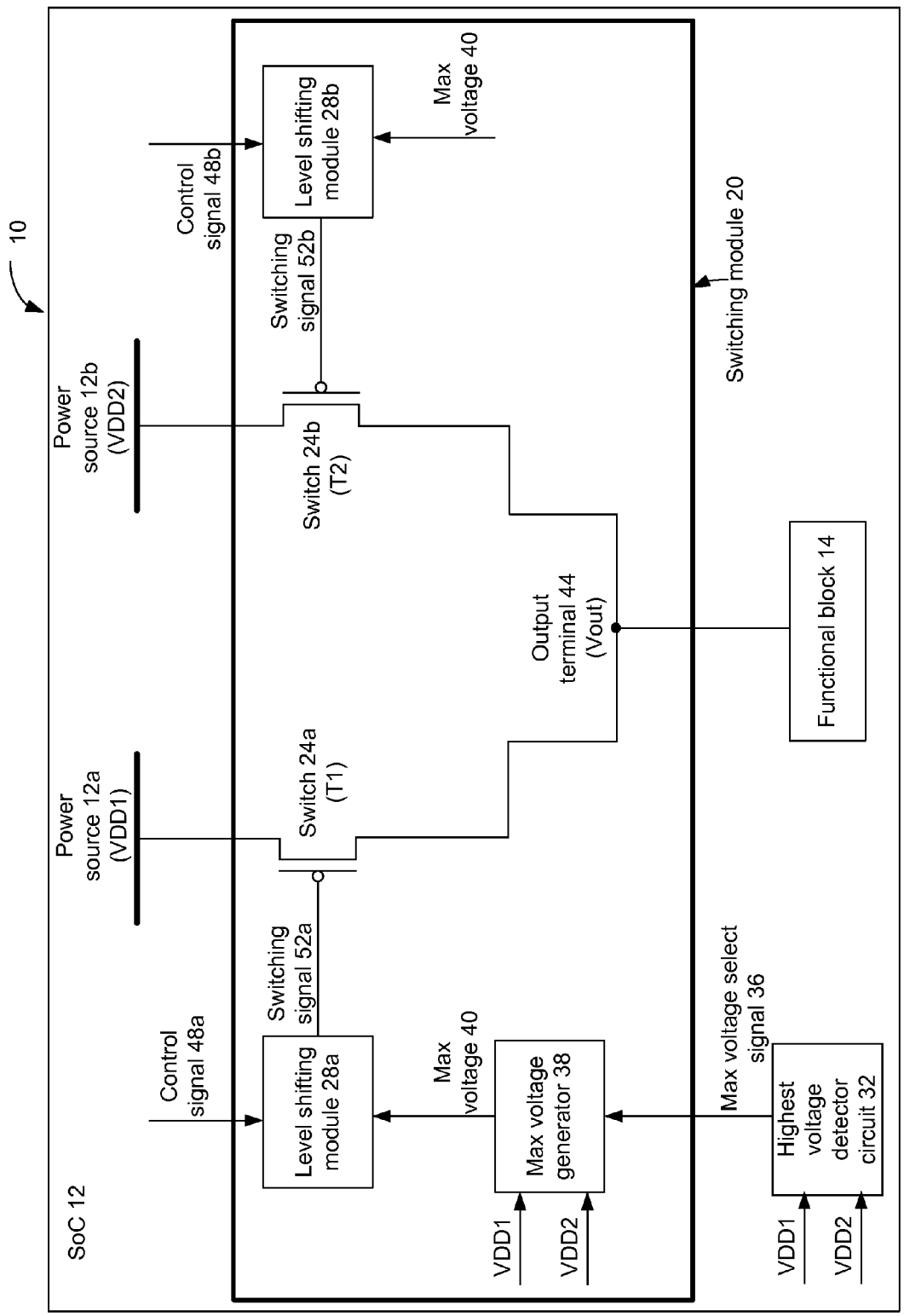
FIG. 3 illustrates an example implementation of the system of FIG. 1 in more detail, in accordance with an embodiment of the present disclosure.

In an embodiment, each of the switches 24a and 24b comprises one or more transistors. For example, FIG. 3 illustrates an example implementation of the switches 24a and 24b of the system 10 of FIG. 1 in more detail. In the example embodiment of FIG. 3, the switch 24a comprises a P-channel metal oxide semiconductor field effect transistor (MOSFET) T1, and the switch 24b comprises another P-channel MOSFET T2 (although in other embodiments, the switches 24a and/or 24b may comprise one or more other types of transistors). For example, as illustrated in FIG. 3, the switching signals 52a and 52b are respectively coupled to the control terminals (e.g., gate terminals) of the transistors T1 and T2, the power sources 12a and 12b are respectively coupled to the source terminals of the transistors T1 and T2, and the output terminal 44 is coupled to the drain terminals of the transistors T1 and T2, Referring to FIGS. 1 and 3, in an embodiment, each of the switching signals 52a and 52b is generated by a corresponding level shifting module. For example, in an embodiment, the switching signal 52a is generated by a level shifting module 28a, and the switching signal 52b is generated by a level shifting module 28b. Each of the level shifting modules 28a, 28b receives (i) a corresponding control signal (e.g., the level shifting module 28a receives a control signal 48a, and the level shifting module 28b receives a control signal 48b) and (ii) the max voltage 40. Based on the corresponding control signal, each of the level shifting modules 28a and 28b selectively outputs one of a ground voltage and the max voltage 40.

In an example, a low value of the control signal 48a results in the level shifting module 28a generating the switching signal 52a at the max voltage 40, and a high value of the control signal 48a results in the level shifting module 28a generating the switching signal 52a at the ground voltage (although in another example, the opposite may happen). For example, as illustrated in FIG. 2a, when the control signal 48a is low prior to time t2, the switching signal 52a is at the max voltage 40. Also, when the control signal 48a is high between time t2 and time t4, the switching signal 52a is at the ground voltage.

Similarly, a low value of the control signal 48b results in the level shifting module 28b generating the switching signal 52b at the max voltage 40, and a high value of the control signal 48b results in the level shifting module 28b generating the switching signal 52b at the ground voltage (although in another example, the opposite may happen), as illustrated in FIG. 2a. In an embodiment, to prevent simultaneous switching on of the switches 24a and 24b, the control signals 48a and 48b may not simultaneously be high.

Accordingly, in the embodiment of FIG. 3 in which the switches 24a and 24b are P-channel MOSFETs, a low value of the control signal 48a and a high value of the control signal 48b (e.g., prior to time t2 in FIG. 2a) result in switching off of the switch 24a and switching on of the switch 24b, thereby resulting in the power source 12b supplying power to the functional block 14, as illustrated in FIG. 2a. On the other hand, a high value of the control signal 48a and a low value of the control signal 48b (e.g., between time t2 and time t4 in FIG. 2a) result in switching on of the switch 24a and switching off of the switch 24b, thereby resulting in the power source 12a supplying power to the functional block 14.

By generating the switching signals 52a and 52b at one of the ground voltage and the max voltage 40 (e.g., instead of one of the ground voltage and any other voltage level), the switching module 20 fully switches off one of the power supplies and avoids current leakage. For example, consider a scenario in which (i) the power source 12a is to supply power to the functional block 14 (i.e., the switch 24a is to be switched on, and the switch 24b is to be switched off) and (ii) VDD1 is greater than VDD2. The switch 24a can be switched on by generating the switching signal 52a at the ground voltage. The switch 24b can be switched off by generating the switching signal 52b at a high voltage. In such a scenario, if the switching signal 52b is generated at a voltage that is not high enough, e.g., is lower than the voltage VDD1, then the switch 24b may not be fully switched off (e.g., as the voltage at the gate of the switch 24b is not high enough to turn off the switch 52b, compared to the voltage VDD1 at a source/drain terminal of the switch 24b). Accordingly, current may be leaked from the power source 12a, through the switched on switch 24a and through the partially switched off switch 24b, towards the power source 12b (in addition to the current from the power source 12a to the functional block 14). However, generating the switching signal 52b at the max voltage 40 (in this scenario, the max voltage 40 will be equal to VDD1, as VDD1 is greater than VDD2) will result in fully switching off of the switch 24b, thereby preventing any leakage current through the switch 24b.

Figure 4:
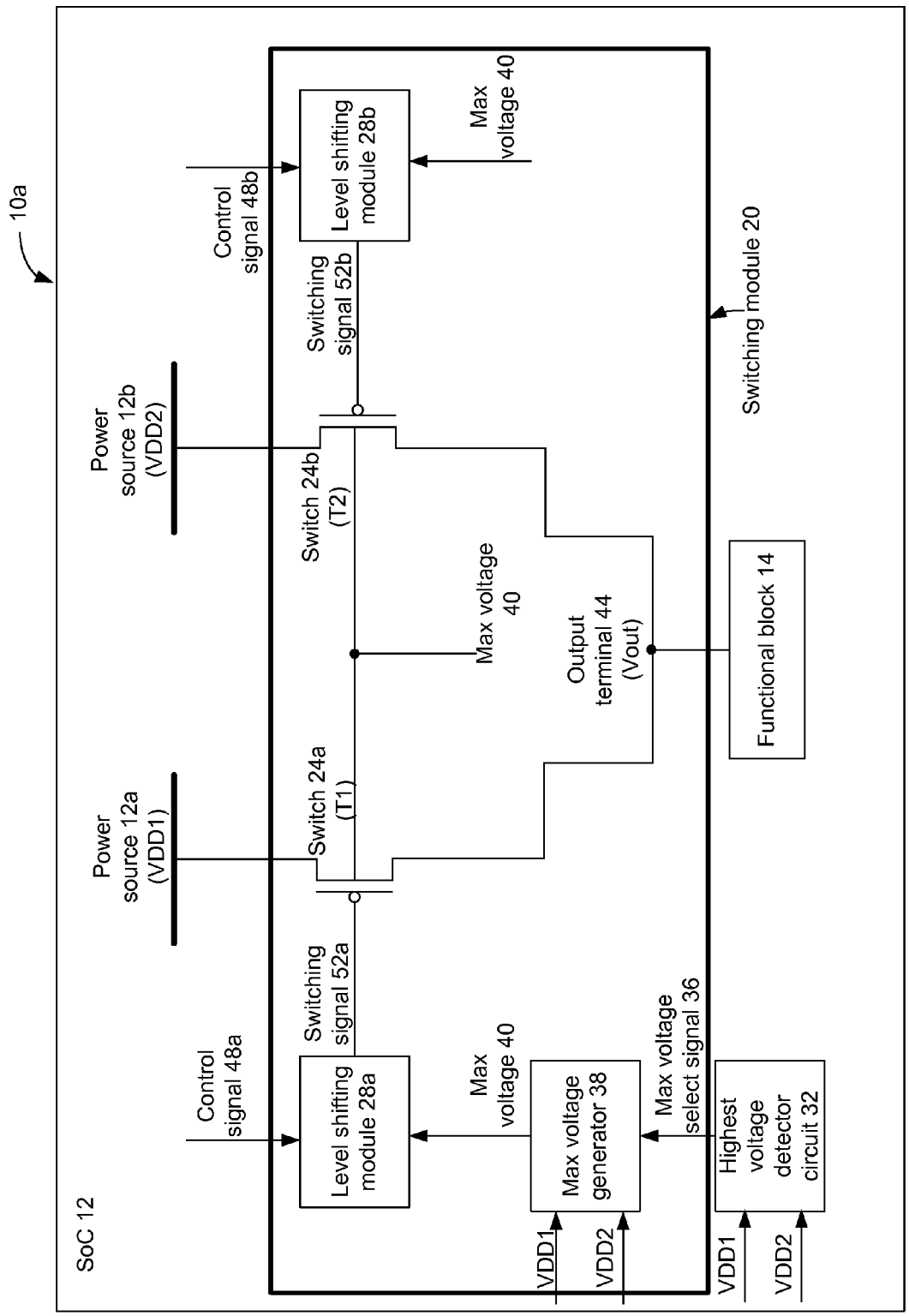
FIG. 4 schematically illustrates another system comprising a functional block, a switching module, and a plurality of power sources, in accordance with an embodiment of the present disclosure.
Figure 5:
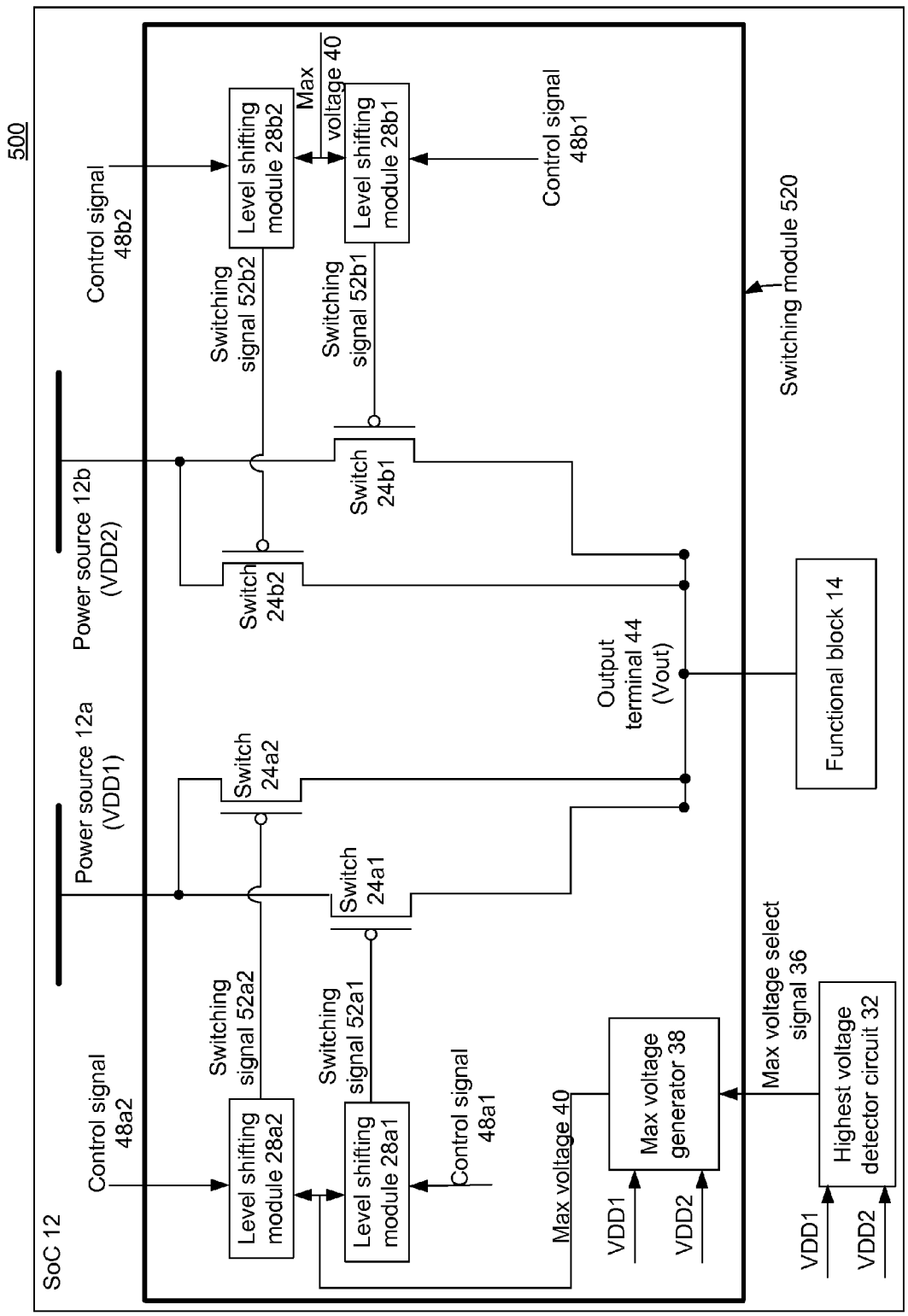
FIG. 5 schematically illustrates another system comprising a functional block, a switching module, and a plurality of power sources, in accordance with an embodiment of the present disclosure.

FIG. 4 schematically illustrates a system 10a comprising the functional block 14, the switching module 20, and the plurality of power sources 12a and 12b. The system 10a of FIG. 4 is similar to the system 10 of FIGS. 1 and 3. However, unlike the system 10 of FIGS. 1 and 3, in the system 10a of FIG. 4 the N-wells of the P-channel transistors of each of the switches 24a and 24b are coupled to the max voltage 40. Coupling, for example, the N-well of the switch 24a to the max voltage 40 ensures that the N-well is at a voltage that is always equal to or higher than the voltages at the source and drain terminals of the switch 24a. This prevents leakage through the parasitic diode between (i) the N-well and (ii) one of the source and drain terminals of the switch 24a and 24b FIG. 5 schematically illustrates a system 500 comprising the functional block 14, a switching module 520, and the plurality of power sources 12a and 12b. Various components of the system 500 are at least in part similar to the corresponding components of the system 10 of FIGS. 1 and 3, and these components in both systems 10 and 500 have been labeled similarly. For example, similar to the system 10, the system 500 also comprises the power sources 12a and 12b, the functional block 14, the highest voltage detector circuit 32 and the max voltage generator 38. Also, similar to the system 10, the system 500 generates max voltage select signal 36 and the max voltage 40.

In an embodiment, and as will be discussed in detail below, the system 500 is used to ensure soft start and soft switch over of the power sources 12a and 12b (e.g., prevents high current during switching of the power sources).

The switching module 520 of FIG. 5 comprises four switches 24a1, 24a2, 24b1 and 24b2, each of which are, in an example, P-channel MOSFETs. The switches 24a1, 24a2, 24b1 and 24b2 may respectively be controlled by switching signals 52a1, 52a2, 52b1 and 52b2, which may be respectively generated by level shifting modules 28a1, 28a2, 28b1 and 28b2, as illustrated in FIG. 5. The level shifting modules 28a1, 28a2, 28b1 and 28b2 are respectively controlled by control signals 48a1, 48a2, 48b1 and 48b2. In an embodiment, each of the switching signals 52a1, 52a2, 52b1 and 52b2 has a voltage value that is one of (i) the ground voltage and (ii) the max voltage 40, based on the corresponding control signals.

Each of the level shifting modules and the corresponding switches of FIG. 5 operate in a manner that is similar to the operation of the level shifting modules and the corresponding switches of FIGS. 1 and 3. For example, a low value of the control signal 48a1 results in the level shifting module 28a1 generating the switching signal 52a1 at the max voltage 40, and a high value of the control signal 48a1 results in the level shifting module 28a1 generating the switching signal 52a1 at the ground voltage. Accordingly, a high value of the control signal 48a1 results in switching on of the switch 24a1, thereby resulting in the power source 12a supplying power to the functional block 14 through the switched on switch 24a1. Each of the other level shifting modules 28a2, 28b1 and b2 (and the corresponding switches) also operate in a similar manner.

The transistor of the switch 24a1 is larger in size (and has a higher current rating) compared to the transistor of the switch 24a2 (e.g., as the switch 24a1 may carry higher current compared to the switch 24a2, and the switch 24a2 is mainly useful during changing of the power supply). As an example, the transistor of the switch 24a1 is about 8 times the size of the transistor of the switch 24a2. Similarly, the transistor of the switch 24b1 is larger in size (and has a higher current rating) compared to the transistor of the switch 24b2.

Figure 6:
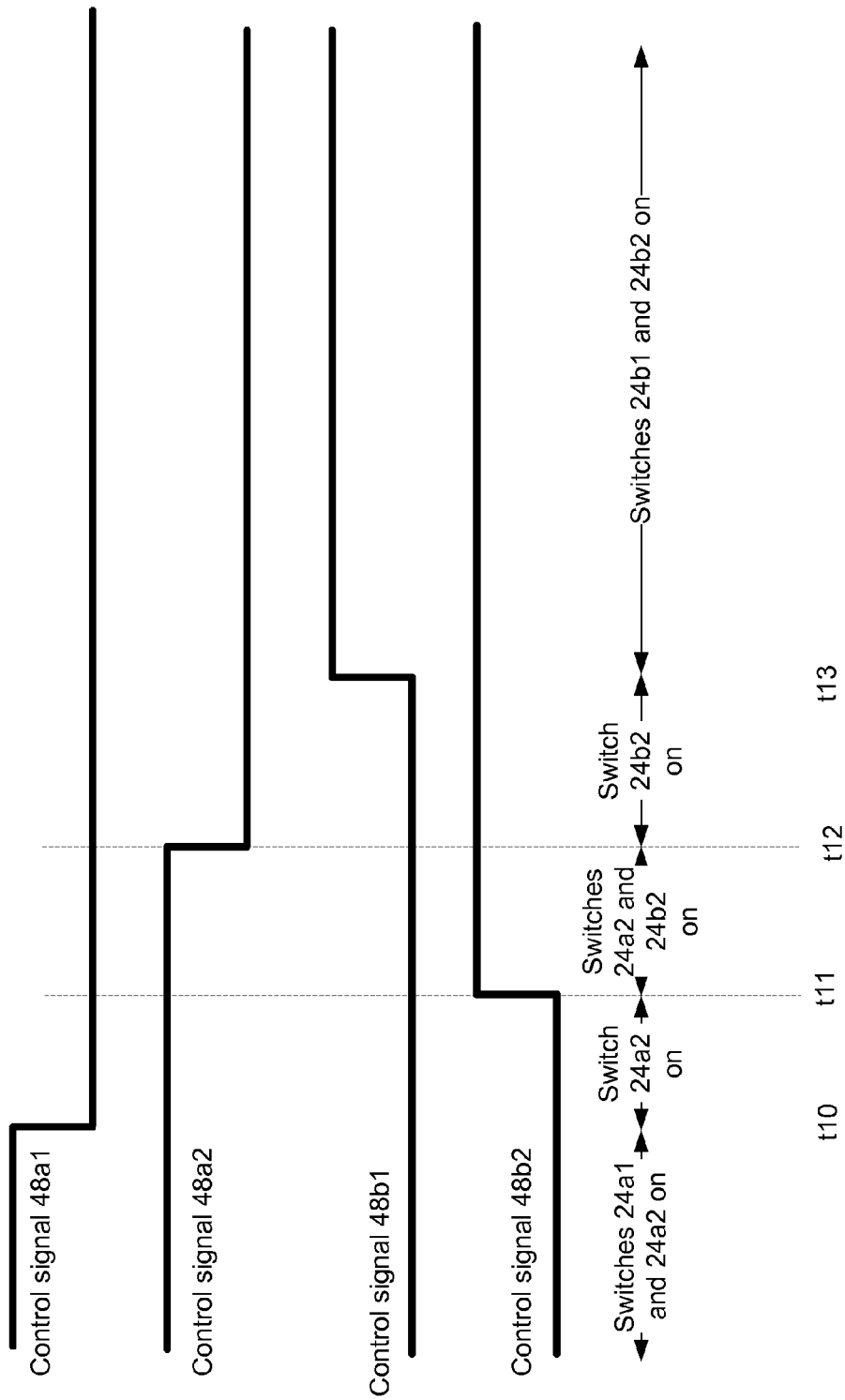
FIG. 6 illustrates timing diagram of various signals of the system of FIG. 5, in accordance with an embodiment of the present disclosure.

FIG. 6 illustrates a timing diagram of various signals of the system 500 of FIG. 5. More specifically, the timing diagram of FIG. 6 illustrates switching a supply of power from the power source 12a to the power source 12b (i.e., in the initial part of the timing diagram of FIG. 6, power is supplied to the functional block 14 from the power source 12a; while in the latter part of the timing diagram of FIG. 6, power is supplied to the functional block 14 from the power source 12b).

Referring to FIGS. 5 and 6, prior to time t10, the control signals 48a1 and 48a2 are high, and the control signals 48b1 and 48b2 are low. Accordingly, each of the switching signals 52a1 and 52a2 is at the ground voltage, and each of the switching signals 52b1 and 52b2 is at the max voltage 40. Thus, prior to time t10, the switches 24a1 and 24a2 are on, and the switches 24b1 and 24b2 are off. Accordingly, power to the functional block 14 is supplied from the power source 12a through the switches 24a1 and 24a2.

It may be desired to switch the power supply, e.g., such that the power source 12b supplies power to the functional block 14. To accomplish the switch-over of the power supply, at time t10, the control signal 48a1 is made low. Between time t10 and time t11, only the control signal 48a2 is high and only the switch 24a2 is on. Accordingly, between time t10 and time t11, the power to the functional block 14 is supplied from the power source 12a through the switch 24a2.

At time t11, the control signal 48b2 is made high. Between time t11 and time t12, the control signals 48a2 and 48b2 are both high, and both switches 24a2 and 24b2 are on. Power to the functional block 14 is supplied from (i) the power source 12a through the switch 24a2 and (ii) the power source 12b through the switch 24b2. Thus, between time t11 and time t12, power from both the power sources 12a and 12b are supplied to the functional block 14. In an embodiment, the time duration between the time t11 and t12 is kept relatively short, to prevent a simultaneous supply of power from both the power sources 12a and 12b to the functional block 14 for a prolonged period of time.

At time t12, the control signal 48a2 is made low. Between time t12 and time t13, only the control signal 48b2 is high, and only the switch 24b2 is on. During this time period, power to the functional block 14 is supplied from the power source 12b through the switch 24b2.

At time t13, the control signal 48b1 is also made high. Subsequent to time t13, the control signals 48b1 and 48b2 are both high, and both the switches 48b1 and 48b2 are on. Power to the functional block 14 is supplied from the power source 12b through the switches 24b1 and 24b2.

As previously discussed, the transistor of the switch 24a1 is larger in size compared to the transistor of the switch 24a2, and the transistor of the switch 24b1 is larger in size compared to the transistor of the switch 24b2. Thus, as illustrated in FIG. 6, during switch-over of power from the power source 12a to the power source 12b, first the larger transistor 24a1 is switched off, and then the smaller transistors 24a2 and 24b2 both transmit power to the functional block 14. Subsequently, the smaller transistor 24a2 is switched off, and subsequently the larger transistor 24b1 is switched on, resulting in supply of power from both transistors 24b1 and 24b2.

Switch-over of power from the power source 12a to the power source 12b in the manner illustrated in FIG. 6 facilitates, for example, the use of smaller size transistors 24a2 and 24b2 which consequently allow relatively less current to pass when switched on. In an embodiment, power drawn from the power source 12a is gradually decreased, and power drawn from the power source 12b is gradually increased during the switch-over. This prevents any initial rush current from the power source 12b during the switch-over (e.g., thereby improving a transient behavior of the system 10, and putting less stress on the power source 12b and associated switches). Also, as illustrated in FIG. 6, the functional block 14 receives uninterrupted power during the switch-over.

Figure 7:
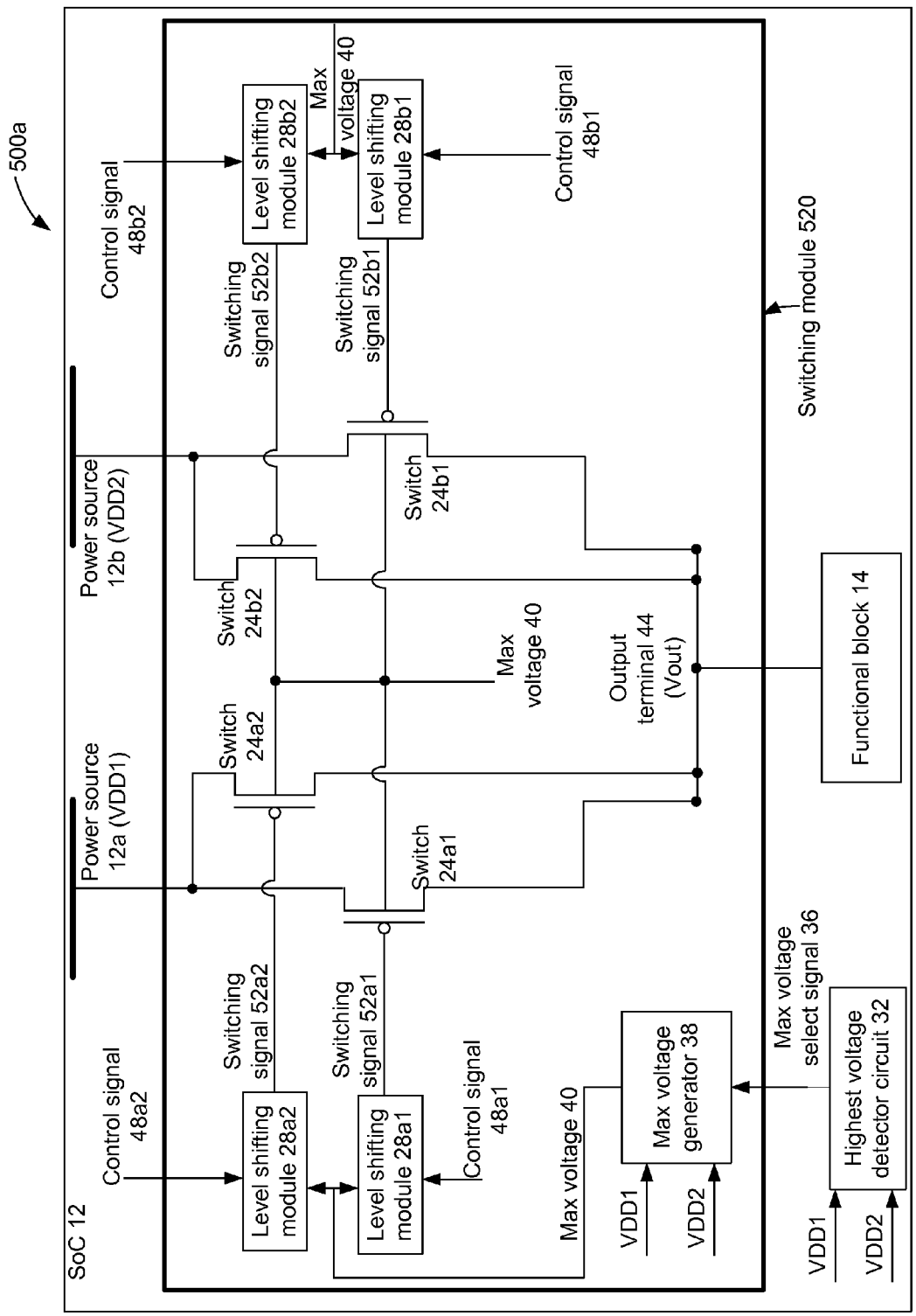
FIG. 7 schematically illustrates another system comprising a functional block, a switching module, and a plurality of power sources, in accordance with an embodiment of the present disclosure.

FIG. 7 schematically illustrates a system 500a comprising the functional block 14, the switching module 520, and the plurality of power sources 12a and 12b. The system 500a is similar to the system 500 of FIG. 5. However, in the system 500a of FIG. 7, the N-wells of the transistors of each of the switches 24a1, 24a2, 24b1 and 24b2 are coupled to the max voltage 40. As discussed with respect to the system 10a, coupling the N-wells of the transistors of each of the switches 24a1, 24a2, 24b1 and 24b2 to the max voltage 40 prevents leakage through parasitic diode between (i) the N-well and (ii) one of the corresponding source and drain terminals of each of the switches.

Figure 8:
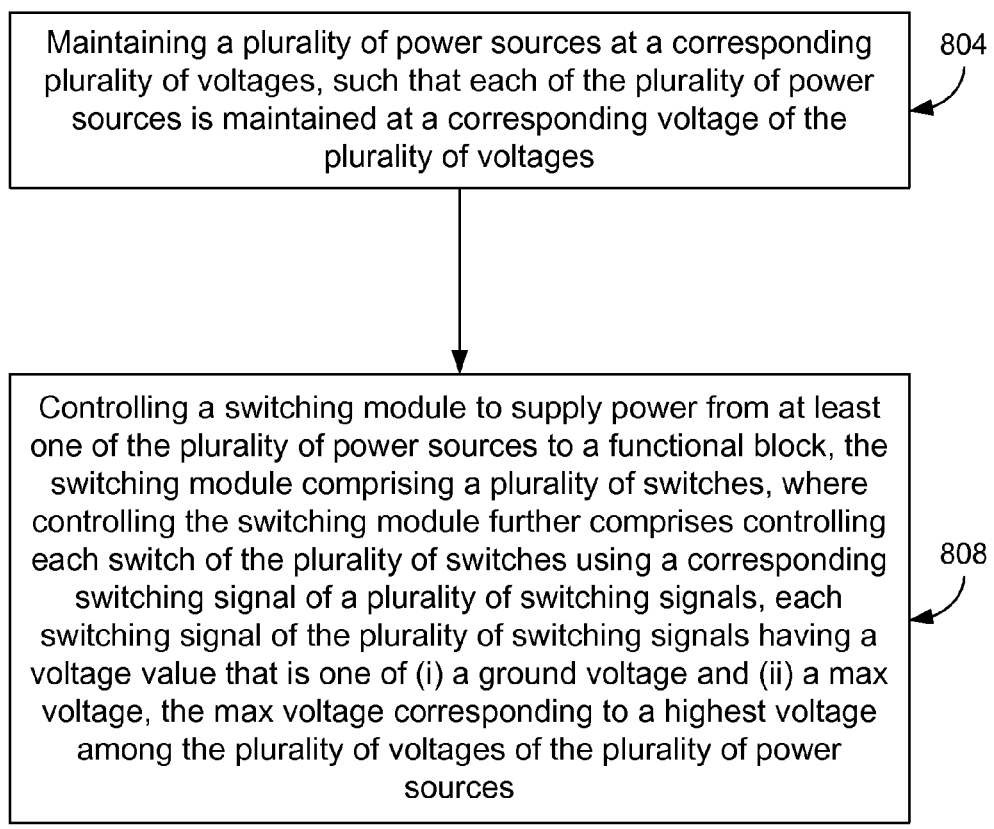
FIG. 8 is a flow diagram illustrating a method for switching between power sources having different voltages, in accordance with an embodiment of the disclosure.

FIG. 8 illustrates an example method 800 for operating the systems of FIGS. 1, 3-5 and 7. At 804, a plurality of power sources (e.g., power sources 12a and 12b) are maintained at a corresponding plurality of voltages (e.g., VDD1 and VDD2), such that each of the plurality of power sources is maintained at a corresponding voltage of the plurality of voltages. At 808, a switching module (e.g., switching module 20) is controlled to supply power from at least one of the plurality of power sources to a functional block (e.g., functional block 14), the switching module comprising a plurality of switches (e.g., switches 24a and 24b). Controlling the switching module further comprises controlling each switch of the plurality of switches using a corresponding switching signal of a plurality of switching signals (e.g., switching signals 52a and 52b), each switching signal of the plurality of switching signals having a voltage value that is one of (i) a ground voltage and (ii) a max voltage (e.g., the max voltage 40), the max voltage corresponding to the highest voltage among the plurality of voltages of the plurality of power sources.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A system comprising:
a functional block;
a plurality of power sources, each of the plurality of power sources being maintained at a corresponding voltage; and
a switching module having a plurality of switches, the switching module configured to supply power from at least one of the plurality of power sources to the functional block, each of the plurality of switches being controlled by a corresponding switching signal having a voltage value that is one of (i) a ground voltage and (ii) a max voltage, the max voltage corresponding to a highest voltage among the voltages of the plurality of power sources, a first switch of the plurality of switches configured to, during a first period of time, output a first voltage to the functional block, the first voltage being equal to the max voltage, and a second switch of the plurality of switches configured to, during a second period of time, output a second voltage to the functional block, the second voltage being substantially less than the max voltage.

2. The system of claim 1, wherein
a well of at least one switch of the plurality of switches (i) is isolated from an output of the at least one switch and (ii) receives the max voltage.

3. The system of claim 1, further comprising:
a highest voltage detector circuit configured to generate a max voltage select signal that is indicative of a power source of the plurality of power sources that has the highest voltage among the voltages of the plurality of power sources.

4. The system of claim 3, further comprising a max voltage generator configured to:
receive (i) the voltages of the plurality of power sources and (ii) the max voltage select signal; and
based at least in part on the received voltages of the plurality of power sources and the max voltage select signal, generate the max voltage.

5. The system of claim 3, wherein the highest voltage detector circuit is configured to generate the max voltage select signal based at least in part on a comparison of the voltages of the plurality of power sources.

6. The system of claim 3, wherein the highest voltage detector circuit is configured to generate the max voltage select signal based at least in part on receiving an indication of the voltage levels of the plurality of power sources.

7. The system of claim 1, wherein the switching module further comprises:
a plurality of level shifting modules corresponding to the plurality of switches, wherein each of the plurality of level shifting modules is configured to:
receive a corresponding control signal and the max voltage;
generate the corresponding switching signal such that, based at least in part on the corresponding control signal, the corresponding switching signal is at a voltage value that is one of (i) the ground voltage and (ii) the max voltage; and
output the corresponding switching signal to a corresponding switch of the plurality of switches.

8. The system of claim 1, wherein each of plurality of switches is a P-channel transistor.

9. The system of claim 1, wherein the well of at least one switch of the plurality of switches comprises an N-well.

10. The system of claim 1, wherein:
the plurality of power sources comprises a first power source and a second power source; and
the plurality of switches comprises (i) the first switch configured to selectively supply power from the first power source to the functional block, (ii) the second switch configured to selectively supply power from the first power source to the functional block, (iii) a third switch configured to selectively supply power from the second power source to the functional block, and (iv) a fourth switch configured to selectively supply power from the second power source to the functional block.

11. A system comprising:
a functional block;
a plurality of power sources, each of the plurality of power sources being maintained at a corresponding voltage; and
a switching module having a plurality of switches, the switching module configured to supply power from at least one of the plurality of power sources to the functional block, each of the plurality of switches being controlled by a corresponding switching signal having a voltage value that is one of (i) a ground voltage and (ii) a max voltage, the max voltage corresponding to a highest voltage among the voltages of the plurality of power sources, the plurality of power sources comprising a first power source and a second power source, the plurality of switches comprising (i) a first switch configured to selectively supply power from the first power source to the functional block, (ii) a second switch configured to selectively supply power from the first power source to the functional block, (iii) a third switch configured to selectively supply power from the second power source to the functional block, and (iv) a fourth switch configured to selectively supply power from the second power source to the functional block, the first switch being larger in size compared to the second switch, and the third switch being larger in size compared to the fourth switch.

12. A method comprising:
maintaining a plurality of power sources at a corresponding plurality of voltages, such that each of the plurality of power sources is maintained at a corresponding voltage of the plurality of voltages; and controlling a switching module to supply power from at least one of the plurality of power sources to a functional block, the switching module comprising a plurality of switches, wherein controlling the switching module further comprises:
  controlling respective switches of the plurality of switches using a corresponding switching signal of a plurality of switching signals, respective switching signals of the plurality of switching signals having a voltage value that is one of (i) a ground voltage and (ii) a max voltage, the max voltage corresponding to a highest voltage among the plurality of voltages of the plurality of power sources,
  controlling a first switch of the plurality of switches such that, during a first period of time, the first switch outputs a first voltage to the functional block, the first voltage being equal to the max voltage, and
  controlling a second switch of the plurality of switches such that, during a second period of time, the second switch outputs a second voltage to the functional block, the second voltage being substantially less than the max voltage.

13. The method of claim 12, further comprising:
isolating a well of at least one switch of the plurality of switches from an output of the at least one switch; and
receiving, by the well of the at least one switch of the plurality of switches, the max voltage.

14. The method of claim 12, further comprising:
generating a max voltage select signal, the max voltage select signal identifying a power source of the plurality of power sources that has the highest voltage among the plurality of voltages of the plurality of power sources.

15. The method of claim 14, further comprising:
receiving (i) the plurality of voltages of the plurality of power sources and (ii) the max voltage select signal; and
based at least in part on the received plurality of voltages of the plurality of power sources and the max voltage select signal, generating the max voltage.

16. The method of claim 14, wherein generating the max voltage select signal further comprises:
generating the max voltage select signal based at least in part on a comparison of the plurality of voltages of the plurality of power sources.

17. The method of claim 14, wherein generating the max voltage select signal further comprises:
generating the max voltage select signal based at least in part on receiving an indication of the voltages of the plurality of power sources.

18. The method of claim 12, further comprising:
generating the plurality of switching signals, wherein generating a switching signal of the plurality of switching signals further comprises:
  receiving (i) a control signal corresponding to the switching signal, and (ii) the max voltage; and
  generating the switching signal such that, based on the corresponding control signal, the switching signal is at a voltage value that is one of (i) the ground voltage and (ii) the max voltage.

19. The method of claim 12, wherein each of plurality of switches is a P-channel transistor, and wherein the well of at least the one switch of the plurality of switches comprises an N-well.

20. A method comprising:
maintaining a plurality of power sources at a corresponding plurality of voltages, such that each of the plurality of power sources is maintained at a corresponding voltage of the plurality of voltages; and
controlling a switching module to supply power from at least one of the plurality of power sources to a functional block, the switching module comprising a plurality of switches, wherein controlling the switching module further comprises:
  controlling respective switches of the plurality of switches using a corresponding switching signal of a plurality of switching signals, respective switching signals of the plurality of switching signals having a voltage value that is one of (i) a ground voltage and (ii) a max voltage, the max voltage corresponding to a highest voltage among the plurality of voltages of the plurality of power sources, a well of at least one switch of the plurality of switches (i) being isolated from an output of the at least one switch, and (ii) receiving the max voltage,
wherein the plurality of power sources comprises a first power source and a second power source, wherein the plurality of switches comprises (i) a first switch configured to selectively supply power from the first power source to the functional block, (ii) a second switch configured to selectively supply power from the first power source to the functional block, (iii) a third switch configured to selectively supply power from the second power source to the functional block, and (iv) a fourth switch configured to selectively supply power from the second power source to the functional block, and wherein controlling each switch of the plurality of switches further comprises:
  simultaneously switching on the first switch and the second switch to supply power from the first power source to the functional block through the first switch and the second switch,
  subsequent to simultaneously switching on the first switch and the second switch, switching on only the second switch to supply power from the first power source to the functional block through the second switch,
  subsequent to switching on only the second switch, switching on the second switch and the fourth switch to supply power from the first power source and the second power source to the functional block through the second switch and the fourth switch, respectively, and
  subsequent to switching on the second switch and the fourth switch, switching on only the fourth switch to supply power from the second power source to the functional block through the fourth switch.

21. The method of claim 20, further comprising:
subsequent to switching on only the fourth switch, switching on the third switch and the fourth switch to supply power from the second power source to the functional block through the third switch and the fourth switch.

22. The method of claim 20, further comprising:
forming the plurality of switches such that the first switch is larger in size compared to the second switch, and the third switch is larger in size compared to the fourth switch.

* * * * *